(12) United States Patent
Chheda et al.

(10) Patent No.: US 7,652,896 B2
(45) Date of Patent: Jan. 26, 2010

(54) COMPONENT FOR IMPEDANCE MATCHING

(75) Inventors: Sachin Navin Chheda, Roseville, CA (US); Kirk Yates, Loomis, CA (US); Nitin C. Bhagwath, Lincoln, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 399 days.

(21) Appl. No.: 11/027,431

(22) Filed: Dec. 29, 2004

(65) Prior Publication Data

US 2006/0137907 A1 Jun. 29, 2006

(51) Int. Cl.
*H05K 1/11* (2006.01)
(52) U.S. Cl. .................. 361/794; 361/762; 174/262; 174/265; 29/837
(58) Field of Classification Search .......... 361/313, 361/792–794, 762; 174/250, 262–265; 333/1, 333/4, 34, 238; 29/827, 832, 846, 852, 837
See application file for complete search history.

(56) References Cited

U.S. PATENT DOCUMENTS

| | | | | |
|---|---|---|---|---|
| 4,153,988 A * | 5/1979 | Doo | .......................... | 29/827 |
| 5,278,524 A * | 1/1994 | Mullen | .......................... | 333/1 |
| 5,293,502 A * | 3/1994 | Kimura et al. | .............. | 174/250 |
| 5,745,333 A * | 4/1998 | Frankeny et al. | ............ | 361/313 |
| 5,768,109 A * | 6/1998 | Gulick et al. | ................ | 361/794 |
| 5,904,776 A * | 5/1999 | Donde et al. | ................. | 118/500 |
| 6,225,568 B1 | 5/2001 | Lin et al. | | |
| 6,366,466 B1 | 4/2002 | Leddige et al. | | |
| 6,372,996 B2 | 4/2002 | Lin et al. | | |
| 6,417,675 B1 | 7/2002 | Johnson | | |
| 6,441,319 B1 | 8/2002 | Handforth et al. | | |
| 6,479,764 B1 * | 11/2002 | Frana et al. | .................. | 174/262 |
| 6,501,031 B1 * | 12/2002 | Glovatsky et al. | ........... | 174/262 |
| 6,530,062 B1 | 3/2003 | Liaw et al. | | |
| 6,590,466 B2 | 7/2003 | Lin et al. | | |
| 6,667,895 B2 | 12/2003 | Jang et al. | | |
| 6,686,762 B2 | 2/2004 | Leddige et al. | | |
| 6,700,457 B2 | 3/2004 | McCall et al. | | |
| 6,711,812 B1 * | 3/2004 | Lu et al. | ........................ | 29/852 |
| 6,765,298 B2 | 7/2004 | Chin et al. | | |
| 6,893,961 B2 * | 5/2005 | Akram | ........................ | 438/652 |
| 7,112,285 B2 * | 9/2006 | Chakravorty | .................. | 216/18 |
| 7,154,355 B2 * | 12/2006 | Brunker et al. | .................. | 333/4 |
| 2003/0180011 A1 | 9/2003 | Aronson | | |
| 2004/0046235 A1 | 3/2004 | Oprysko et al. | | |
| 2005/0156319 A1 * | 7/2005 | Oggioni et al. | ............. | 257/774 |
| 2005/0161255 A1 * | 7/2005 | Takada | ........................ | 174/262 |

* cited by examiner

*Primary Examiner*—Dean A. Reichard
*Assistant Examiner*—Xiaoliang Chen

(57) ABSTRACT

A component for insertion into a hole in a multiple-layer substrate enables impedance matching of the substrate. The component comprises a conductive ground core arranged to extend through multiple-layers of the substrate when the component is inserted, a dielectric layer laterally encasing the conductive ground core, and a signal conductor layer coupled lateral to the dielectric layer.

24 Claims, 9 Drawing Sheets

COMPONENT FOR IMPEDANCE MATCHING

BACKGROUND OF THE INVENTION

The use of a thick printed circuit board (PCB) with high layer counts means that signals travel longer distances to make connections from one layer to another. Signals are susceptible to longer distances of impedance discontinuity. Discontinuity can deteriorate quality of high-speed signals because of signal reflection, attenuation, and other degradation phenomena.

Signal traces in different PCB layers are generally connected by formation of conductive vias extending through the board. Thick boards can be heavily-populated with components and devices with layers that contain intricate, highly-precise traces with fine detail. Vias connecting the traces can similar be highly intricate and tightly-specified. Drilling of small and intricate tightly-specified vias in the thick printed circuit boards is difficult due to various considerations including variation of two-dimensional registration of structures on the different layers, the increased likelihood of drill bit breakage in the increased thickness boards, and others. Usage of vias to transfer signals across different layers adds signal impedance discontinuity, potentially degrading the signal.

Impedance discontinuity problems can become highly significant for high-speed signals that are transferred from one layer to another in a thick printed circuit board. For example, particular difficulties may arise for bladed computers where a very large number of computers are interconnected, either directly or through a network fabric. A high speed interconnect is generally used to connect the multiple computers. The high speed interconnect extends from an individual computer to an interconnect switch through a backplane. The backplane is typically thick to enable multiple routing connections and supply sufficient mechanical strength. The interconnect signals can be moderately high-speed signals with little tolerance for impedance discontinuity and other signal degradation and attenuation occurring in signal transfer through the vias.

SUMMARY

In accordance with an embodiment of a device for usage in a printed circuit board, a component for insertion into a hole in a multiple-layer substrate enables impedance matching of the substrate. The component comprises a conductive ground core arranged to extend through multiple-layers of the substrate when the component is inserted, a dielectric layer laterally encasing the conductive ground core, and a signal conductor layer coupled lateral to the dielectric layer.

BRIEF DESCRIPTION OF THE DRAWINGS

Embodiments of the invention relating to both structure and method of operation, may best be understood by referring to the following description and accompanying drawings whereby.

DETAILED DESCRIPTION

Impedance discontinuity performance is improved by an impedance-controlled component that transfers a signal from one layer to another of a multiple-layer printed circuit board. The component is inserted into a hole drilled into the printed circuit board in a suitable location for transferring a signal from one layer to another.

The impedance-controlled component can prevent signal quality loss on traces that switch layers. In some embodiments, the impedance-controlled component can be used to reduce design and verification complexity by reducing via impedance mismatches. Similarly, board post-processing to reduce impedance discontinuity and associated costs can be avoided using the illustrative structures and techniques. Typically, the illustrative impedance-controlled component has less impedance variation than a "flow-through" via in circumstances that conductive material does not distribute evenly through the via.

Usage of the impedance-controlled component can also enable trace impedance matching irrespective of whether signal paths between layers are connected, particularly in thicker boards. The impedance-controlled component can also attain tighter impedance targets on the printed circuit board through increased impedance control during manufacture of the component.

Figure 1B:
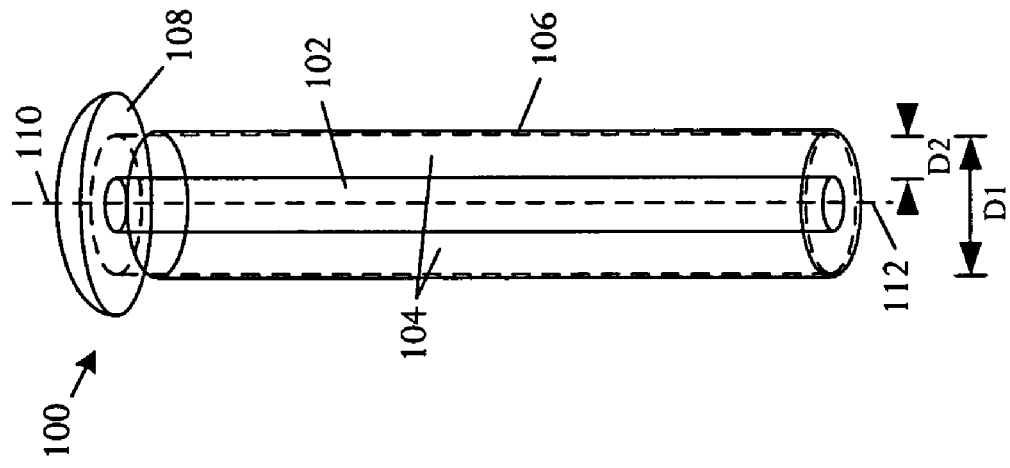
FIGS. 1A and 1B respectively show a two-dimensional side pictorial view and a perspective pictorial view illustrating an embodiment of a component that can be inserted into a hole in a multiple-layer substrate and enables impedance-matched switching of a substrate.
Figure 1A:
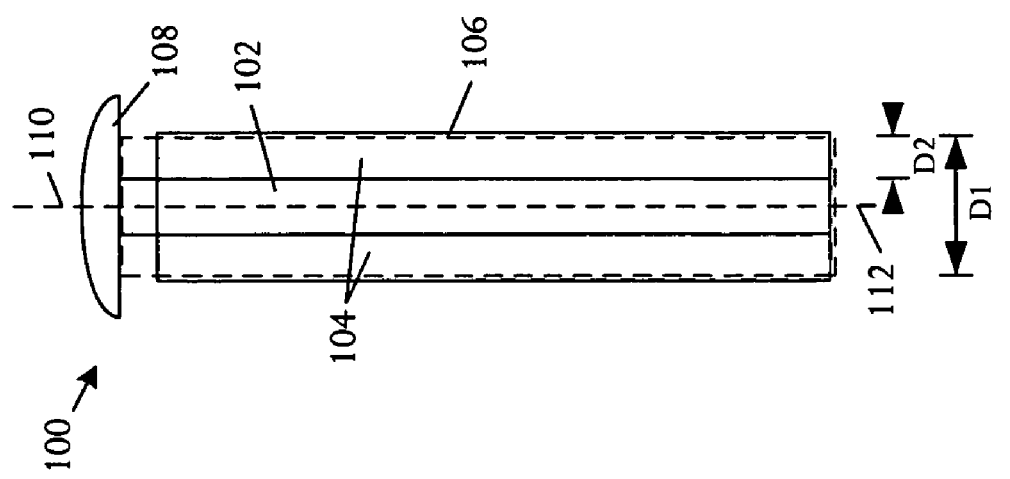

Referring to FIGS. 1A and 1B, a two-dimensional side pictorial view and a perspective pictorial view respectively illustrate an embodiment of a component 100 that can be inserted into a hole in a multiple-layer substrate and enables signal transfer between signal tracks on different layers with impedance-matched switching of a substrate. The component 100 comprises a conductive ground core 102 arranged to extend through multiple-layers of the substrate when the component is inserted, a dielectric layer 104 laterally encasing the conductive ground core, and a signal conductor layer 106 coupled lateral to the dielectric layer 104.

The component 100 may further comprise a conductive ground connect 108 electrically coupled to an end of the conductive ground core 102.

The illustrative component is a single-ended component 100 with a signal conductor layer 106 configured as a single contiguous layer at least partly encasing the dielectric layer 104.

In the illustrative embodiment, the conductive ground core 102 extends along a longitudinal axis 110 that is essentially parallel with a longitudinal axis of the hole in the substrate into which the component 100 is inserted. The dielectric layer 104 has a cylindrical configuration with a longitudinal axis 112 that is coincident with or parallel to the ground core longitudinal axis 110.

Impedance in the component 100 can be controlled by selection of dielectric material in the dielectric layer 104 and relative spacing among the conductive ground core 102 and conductors in the signal conductor layer 102. For example, the diameter d1 of the cylinder forming the signal conductor layer 106 and the thickness d2 of the dielectric layer can be selected to determine component impedance.

The component 100 may be otherwise termed a plug, an insertion-piece, a divet, or other name.

Figure 2A:
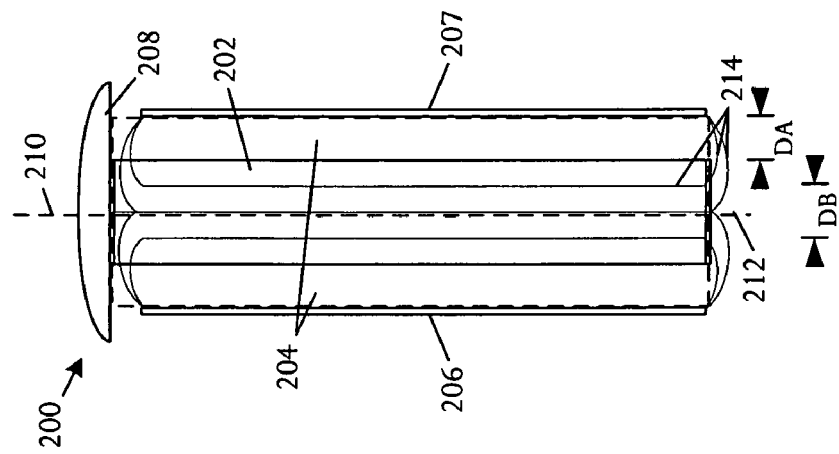
FIGS. 2A, 2B, and 2C respectively show a two-dimensional side pictorial view, a perspective pictorial view, and a two-dimensional side view with conceptual conduction pathways illustrating an embodiment of a component in a differential configuration.
Figure 2B:
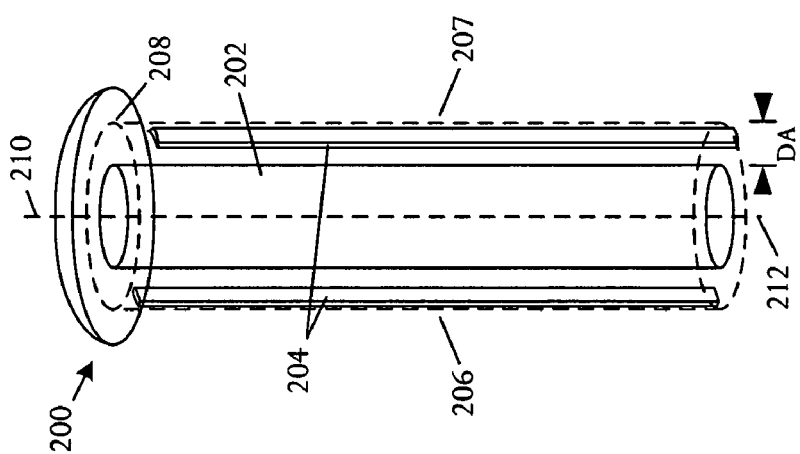
Figure 2C:
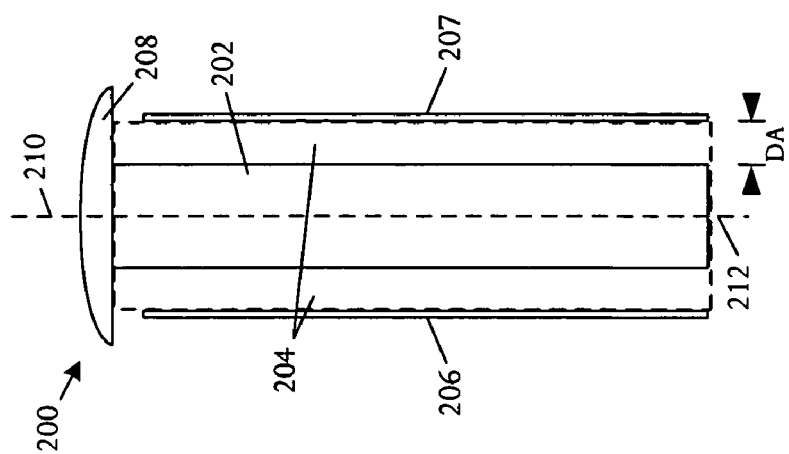

Referring to FIGS. 2A and 2B, a two-dimensional side pictorial view and a perspective pictorial view respectively illustrate an embodiment of a component 200 in a differential configuration. FIG. 2C shows the two-dimensional side pictorial view including conceptual conduction pathways 214. The component is a differential pair component 200 and the signal conductor layer is configured as a pair of separated signal conductors 206 and 207, for example signal_0 conductor 206 and signal_1 conductor 207, capable of conductively contacting different signal tracks in the substrate. The differential pair of signal_0 and signal_1 are referenced mutually to one another and referenced to ground.

The differential component 200 also comprises a conductive ground core 202 that extends along a longitudinal axis 210 that is essentially parallel with a longitudinal axis of the hole in the substrate into which the component 200 is inserted. A dielectric layer 204 has a cylindrical configuration with a longitudinal axis 212 that is coincident with or parallel to the ground core longitudinal axis 210. A conductive ground connect 208 is electrically coupled to an end of the conductive ground core 202 and is used as a ground connect to a printed circuit board.

Signals can be transmitted only within a limited range of impedance. Differential signals commonly have a more limited tolerance to impedance variation than single-ended signals.

The distance DA depicts thickness of the dielectric space formed by the dielectric layer 204. Distance DB illustrates separation between signal_0 and signal_1 in the differential configuration.

Figure 3:
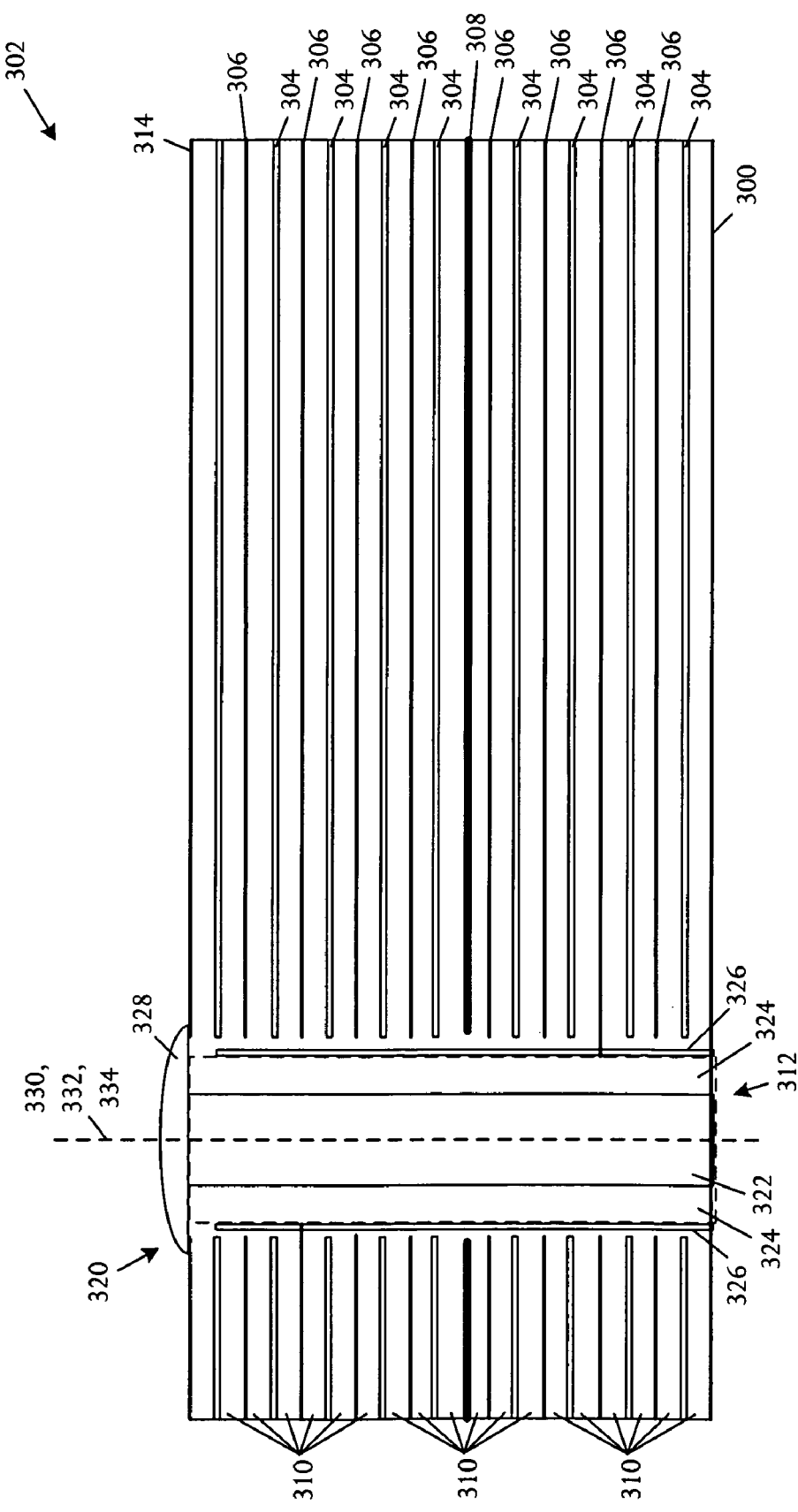
FIG. 3 is a conceptual cross-sectional view showing an embodiment of a substrate including a component capable of usage for impedance matched switching.

Referring to FIG. 3, a conceptual cross-sectional view shows an embodiment of a substrate 300 comprising multiple substrate layers 302 including signal track layers 304 and isolation layers 310, for example dielectric isolation layers. The substrate layer plurality 302 is penetrated by a hole 312 at a location suitable for transferring a signal between at least two signal track layers 304. The substrate 300 further comprises a component 320 for insertion into the hole 312 enabling signal transfer between the signal track layers 304. The component 320 comprises a conductive ground core 322 arranged for insertion through multiple-layers of the substrate layer plurality 302, a dielectric layer 324 laterally encasing the conductive ground core 322, and a signal conductor layer 326 coupled lateral to the dielectric layer 324.

The substrate 300 is typically a printed circuit board. A particular example of a printed circuit board that is susceptible to impedance discontinuity due to thickness is an input/output backplane with a thickness typically from ¼ to ½ inch and from 30 to 45 layers with signals routed between all layers including top and bottom layers and high-speed signal transmission at rates of about 6 gigabytes per second. The illustrative structures and techniques can be applied to both thicker and thinner printed circuit boards with either fewer or more layers, and interfaces transmitting signals at lower and higher rates.

Usage of the component 320 reduces or eliminates impedance discontinuity inherent in usage of vias to interconnect signals in the multiple layers.

In the illustrative embodiment, the substrate 300 includes a ground plane layer 314 on an outer substrate layer and a conductive ground connect 328 in the component 320 that is electrically coupled to an end of the conductive ground core 322 and conductively contacts the ground plane layer 314 when the component 320 is completely inserted into the hole 312.

In some embodiments, the component 320 may be a single-ended component with the signal conductor layer 326 is configured as a single contiguous layer at least partly encasing the dielectric layer 324. In other embodiments, the component 320 may be a differential pair component with the signal conductor layer 326 configured as a pair of separated signal conductors capable of conductively contacting different signal tracks in the substrate 300.

In the illustrative embodiment, the conductive ground core 322 extends along a longitudinal axis 330 that is essentially parallel with a longitudinal axis 332 of the hole in the substrate 300. The dielectric layer 324 has a cylindrical configuration with a longitudinal axis 334 coincident with or parallel to the ground core longitudinal axis 330.

The component 320 can be impedance-controlled by selection of a dielectric material in the dielectric layer 324 and relative spacing among the conductive ground core 322 and the conductors in the signal conductor layer 326.

In one example of an application of the illustrative structures and methods, the substrate 300 may be configured as a multiple-layer printed circuit board (PCB).

Figure 4:
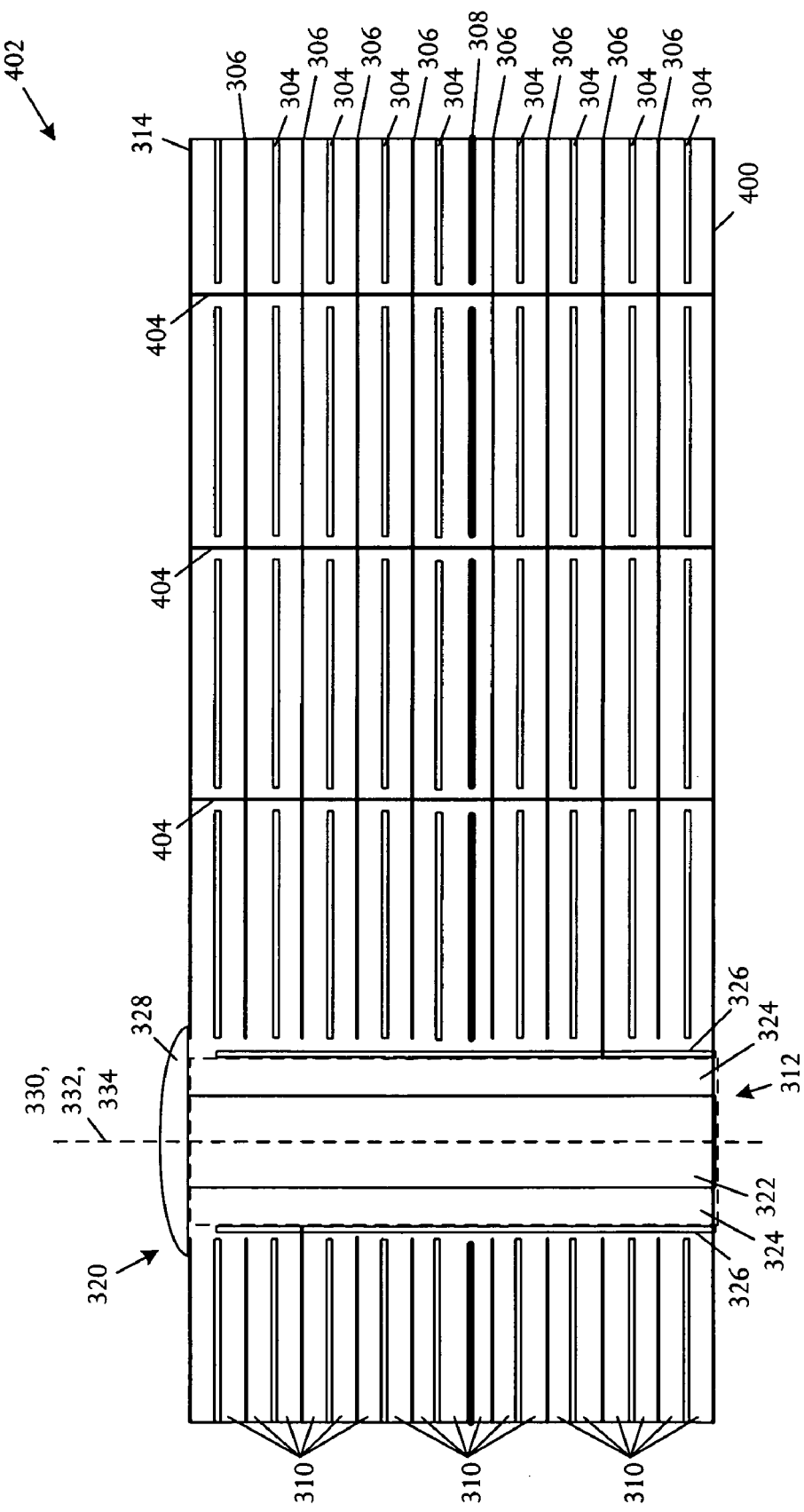
FIG. 4 is a conceptual cross-sectional view showing an embodiment of a substrate including a component capable of usage for impedance matched switching and including ground stitching.

Referring to FIG. 4, a conceptual cross-sectional view shows an embodiment of a substrate 400 that includes ground stitching 404. The substrate 400 comprises multiple substrate layers 402 similar to the layers shown in FIG. 3 and further include ground stitching or vias 404 formed in selected substrate layers in a selected position relative to the component 320. Ground stitching 404 may be added in some implementations to contain electromagnetic interference (EMI). Ground stitching 404 can be configured in the form of vias connecting ground layers in the printed circuit board (PCB), containing and absorbing electromagnetic interference (EMI) within the connected ground layers and stitching 404.

Figure 5A:
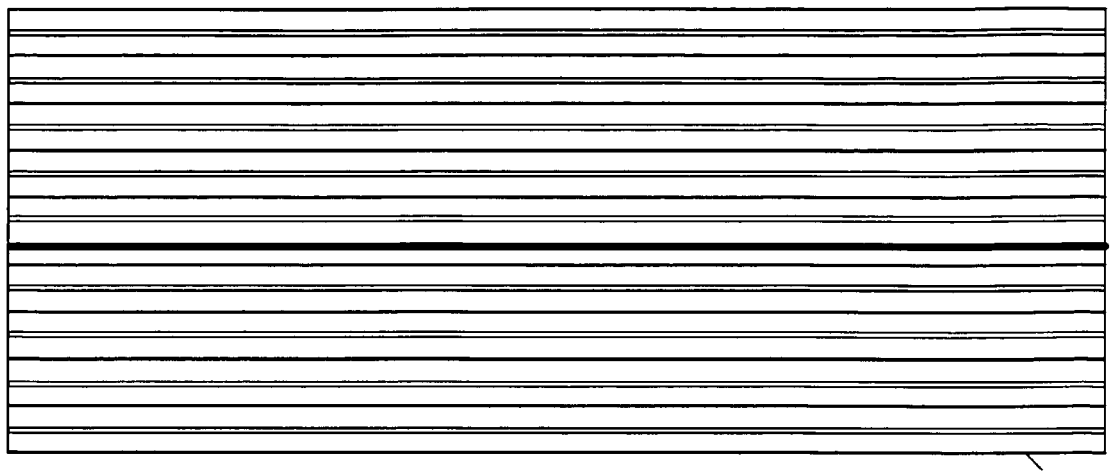
FIGS. 5A through 5C are conceptual cross-sectional views showing an embodiment of a method for performing impedance-matched switching in a substrate.
Figure 5B:
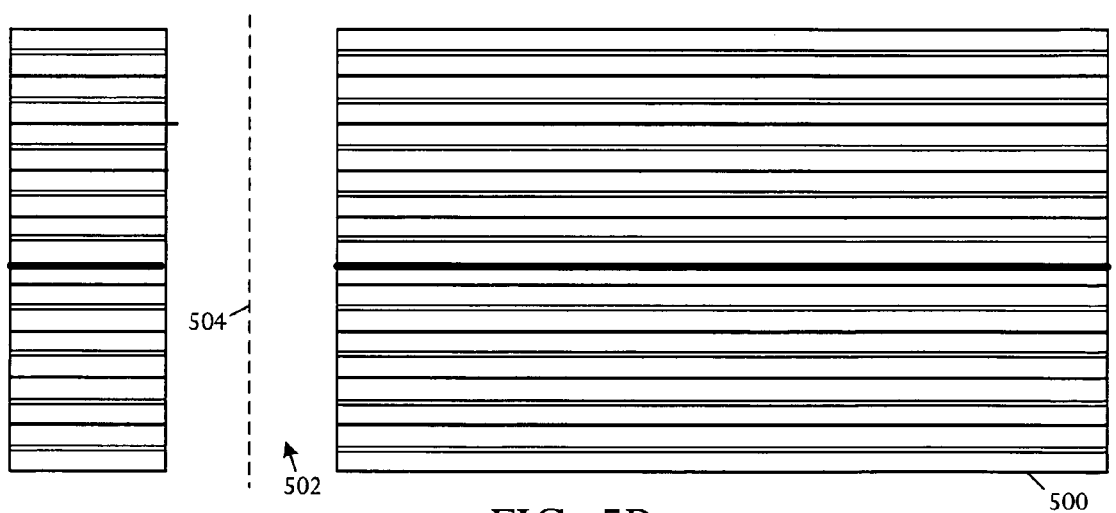
Figure 5C:
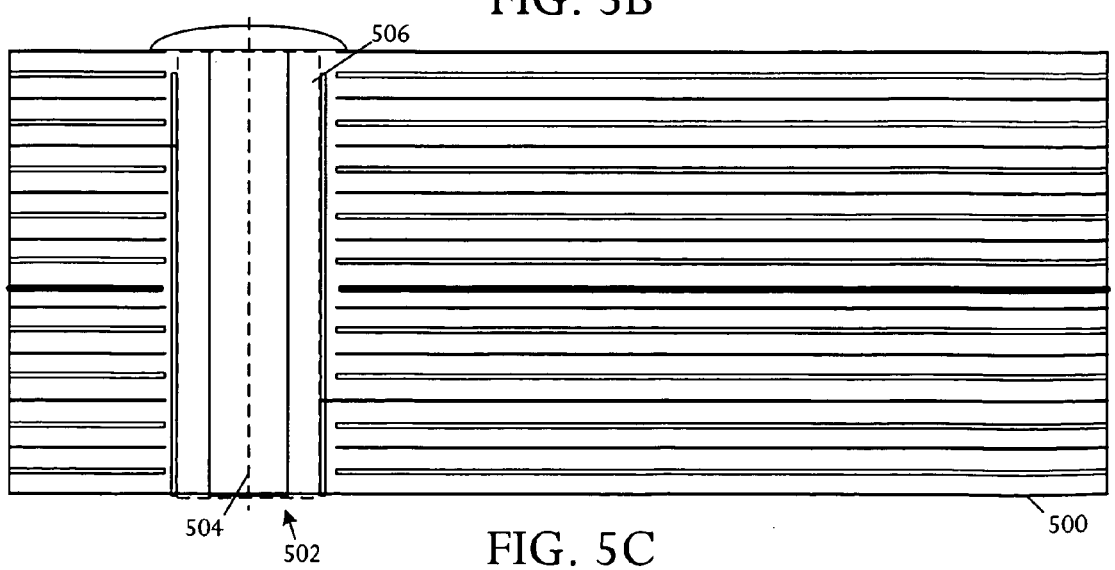

Referring to FIGS. 5A through 5C, multiple conceptual cross-sectional views depict an embodiment of a method for performing impedance-matched switching in a substrate 500. The method can be used to connecting signal tracks in the substrate 500 and comprises supplying the substrate 500 with multiple substrate layers including signal track layers and isolation layers as shown in FIG. 5A. A hole 502, illustrated in FIG. 5B, is formed in the substrate layer plurality 500 at a location suitable for transferring a signal between at least two signal track layers. An impedance-controlled component 504, shown in FIG. 5C, is inserted into the hole 502. The impedance-controlled component 504 includes an internal conductive ground core, a dielectric layer encasing the conductive ground core, and a signal conductor layer overlying the dielectric layer.

The substrate 500 may have a ground plane layer 506 on an outer substrate layer 508. The method generally further comprises conductively coupling a conductive ground connect 508 of the component 504 to the ground plane layer 506.

The component 504 can be installed into the substrate 500, for example into printed circuit board, at the same time as other surface mount technology components or devices upon placement on the board using automatic pick and place equipment. The head, otherwise termed the conductive ground connect, can be soldered to a ground plane on the board on either side of the printed circuit board, depending on how the component 504 is loaded. The ground potential can be the reference plane for the controlled impedance.

Figure 6A:
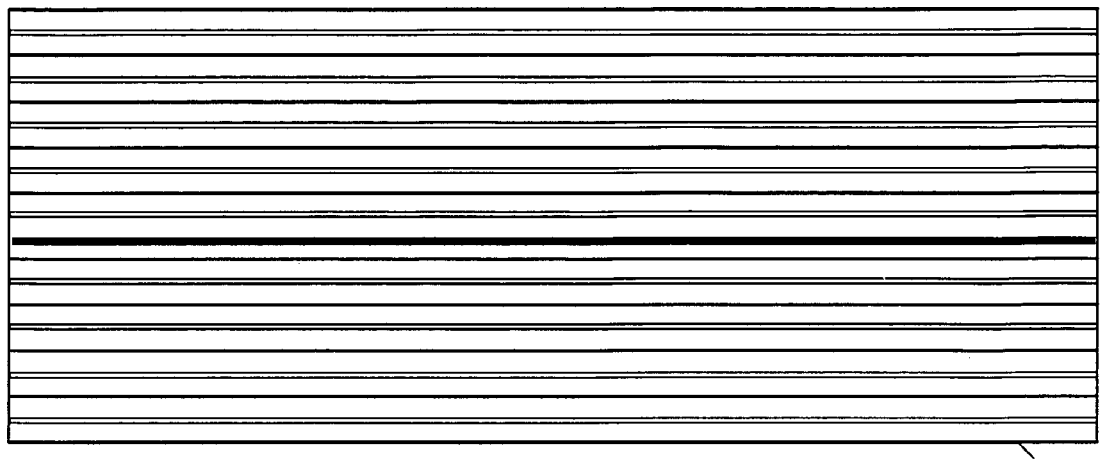
FIGS. 6A through 6C are conceptual cross-sectional views showing an embodiment of a method for preparing a substrate for impedance-matched switching by forming of ground stitching.
Figure 6B:
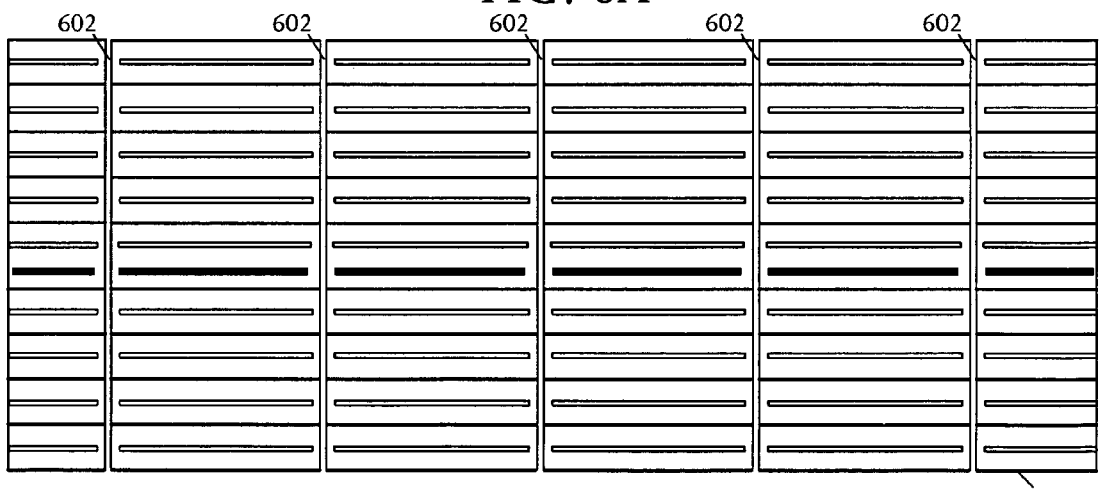
Figure 6C:
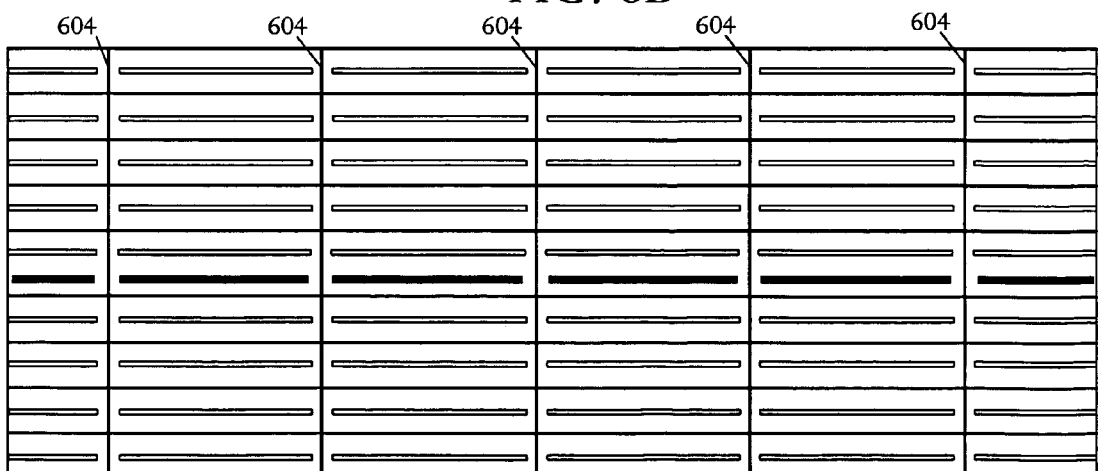

Referring to FIGS. 6A through 6C, multiple conceptual cross-sectional views depict an embodiment of a method for preparing a substrate 600 for impedance-matched switching by adding ground stitching. FIG. 6A shows a substrate 600 before adding ground stitching. Holes 602 are drilled into the substrate 600, typically using laser drilling as shown in FIG. 6B. Ground stitching or vias 604 may be filled into selected substrate layers in a selected position relative to the components.

Referring to FIGS. 7A through 7D, multiple conceptual pictorial views illustrate an embodiment of a method for constructing an impedance-controlled component 700. In the illustrative embodiment, the component 700 has a structure similar to a coaxial cable except that the signal conductor 708 is on the outer component surface and the reference ground 702 is in the interior. In contrast, coaxial cables have the signal conductor on the inside and a ground reference/shield on the outside. Positioning of the signal conductor 708 on the exterior surface is enabled because protection of the signal from noise pickup or emission is typically unnecessary inside the printed circuit board structure. In configurations and conditions that electromagnetic interference (EMI) containment and protection are desirable, ground stitching as exemplified in FIG. 4 may be used.

Figure 7A:
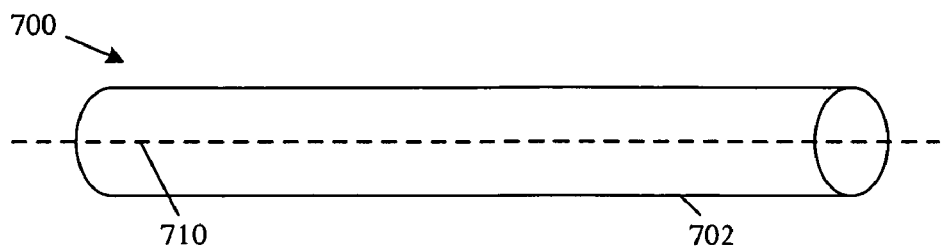
FIGS. 7A through 7D are multiple conceptual pictorial views illustrating an embodiment of a method for constructing an impedance-controlled component.
Figure 7B:
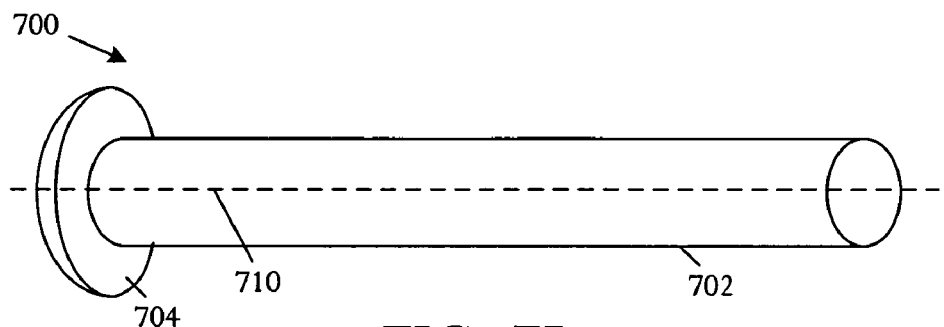
Figure 7C:
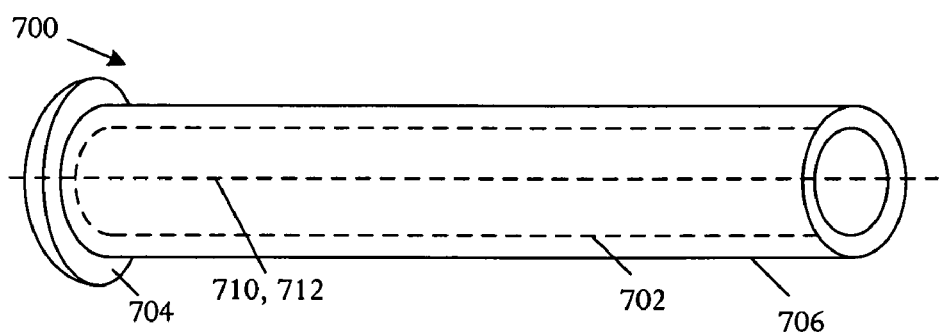
Figure 7D:
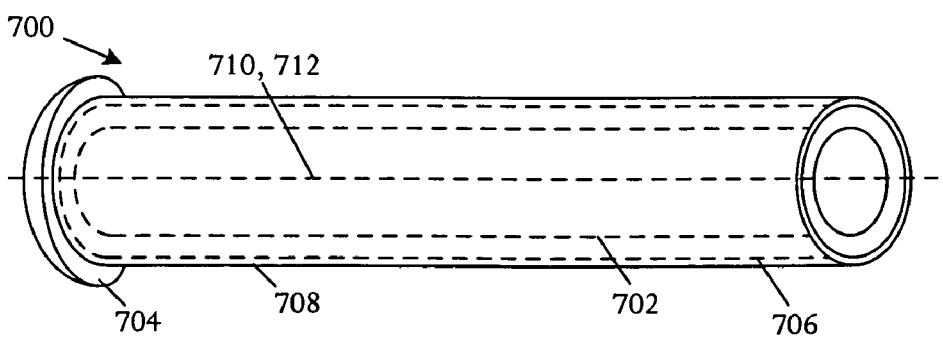

Construction of the component 700 begins by supplying a conductive ground core 702. The ground core 702 is formed from a conductive material, typically a metal or conductive alloy. In an illustrative embodiment, the conductive ground core 702 can be in the form of a cylinder as shown in FIG. 7A. A conductive ground connect 704, depicted in FIG. 7B, can be connected to an end of the conductive ground core 702. In FIG. 7C, a dielectric layer 706 is applied laterally exterior to the conductive ground core 702. A signal conductor layer 708 is formed laterally exterior to the dielectric layer 706, illustrated in FIG. 7D. The signal conductor layer 706 can be constructed from any suitable conductive material such as a solid metal layer, a partial outer layer cover, a mesh, a metallic outer cover strip that makes contact with only a limited portion of the substrate, and the like. The signal conductor layer 708 is shown over the dielectric layer 706, conducting signals over a single contiguous layer at least partly encasing the dielectric layer on the outer cylindrical surface of the component 700 that is functional as a single-ended component.

The conductive core 702 and signal conductor layer 708 are constructed of any suitable conductive material. For example copper or gold are commonly used. The dielectric layer 706 can be constructed from any suitable dielectric material including dielectric plastics, ceramics, coatings, standard grade dielectrics such as FR4, coaxial cable dielectric plastics, and the like. Signal path conductors are typically constructed of metals such as copper or gold, although other suitable materials are possible. Return path conductors can be constructed from materials such as copper, silver or gold, but also tin, bronze, nickel, brass, and others.

In some embodiments, the conductive ground core 702 can be configured as a conductive rod that extends along a longitudinal axis 710. The dielectric layer 706 can also be configured as a cylinder with a longitudinal axis 712 parallel to or coincident with the ground core longitudinal axis 710.

The component 700 can be configured with selected dielectric thickness and thus with selected distances between conductors. Similarly the materials including conductive materials and dielectric materials are selected to control impedance in the component. In some embodiments, impedance is controlled by selecting the dielectric material for usage in the dielectric layer and selecting relative spacing among the conductive ground core and at least one conductor in the signal conductor layer.

Signal impedance depends on the radial distance of separation between the signal conductor and the ground reference core, distance D2 in FIGS. 1A, 1B and distance DA in FIGS. 2A, 2B, 2C. Signal impedance further depends on the diameter and circumference of signal conduction, distance, distance D1 in FIGS. 1A, 1B and distance DB in FIGS. 2A, 2B, 2C. Impedance (Z) is directly proportional to resistivity ($\rho$) and length (L) of the dielectric material, and inversely proportional to the external core area (A) or signal path of the component. Resistance of the internal core or return path of the component can be matched to resistance of the external core or signal path of the component. Resistance matching enables a designer to have additional control of signal impedance. Calculation of impedance is further described in various publications. For example, *High-Speed Digital System Design: A Handbook of Interconnect Theory and Design Practices*, by Stephen H. Hall, Garrett W. Hall, and James A. McCall, Wiley-IEEE Press, 1$^{st}$ Edition, Aug. 25, 2000, describes impedance calculation on page 13.

Using the single-ended component, an Alternating Current (AC) signal on a conductor represents the energy state as a current travels through the substrate with an equivalent current on the return path. Analysis can take into consideration the relationship and physical construction of the return path, return path width, displacement from the signal path to the return path, dielectric material thickness, dielectric material resistivity, substrate dielectric constant, and the like. The various parameter interactions can be highly non-linear and interactions of the various parameters can be complex. To facilitate analysis, impedance can also be calculated and controlled using a two or three-dimensional field solver that enables analysis of the field area by quantizing point in the field to create an actual model of the interactions.

In some embodiments, a field solver may use a boundary element method (BEM) analysis to produce equivalent circuit models of general microstrip and stripline transmission line structures to generate output matrices of derived parasitics such as inductance, capacitance, and resistance matrices. Output matrices can further include voltage and/or current mode shapes and velocities, impedances and various transmission line models that can be read by analysis elements or programs such as SPICE applications for pre-layout simulation and rules generation.

Other field solvers may integrate circuit and transmission line simulations and computes electromagnetic interactions in multiple-layer chip packages and printed circuit boards, taking into account electromagnetic interactions inside packages including package resonance, component coupling, and interactions between circuits and packages.

Any suitable type of field solver may be used, depending on characteristics of the particular printed circuit board or other structure.

Figure 8:
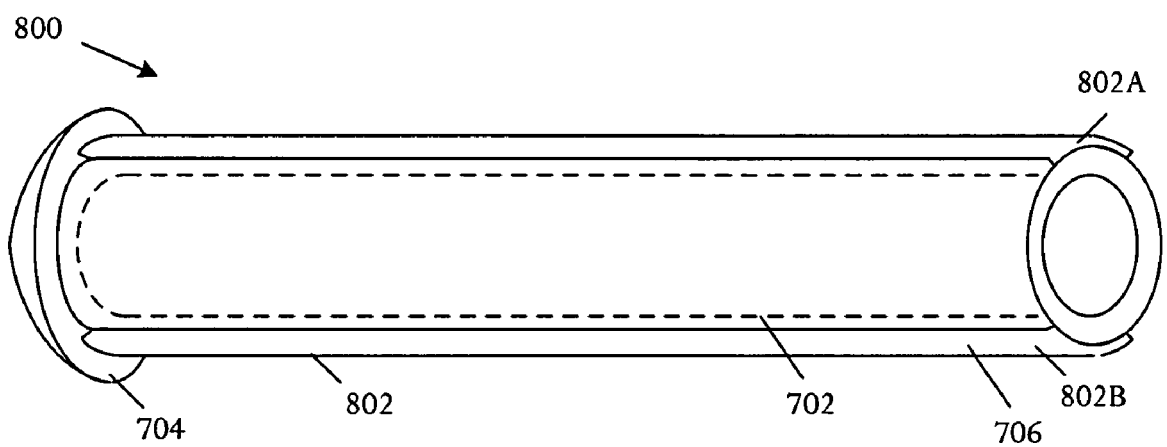
FIG. 8 is a conceptual pictorial view illustrating an embodiment of a method for constructing a differential component.

Referring to FIG. 8, the component can be further processed to form a differential component 800 by forming a pattern in the signal conductor layer 802 that includes first 802A and second 802B and separates the signal conductor layer 802 into differential signal conductors. The differential pair component 800 has the signal conductor layer 802 configured as a pair of separated signal conductors 802A and 802B capable of conductively contacting different signal tracks in a substrate.

Figure 9:
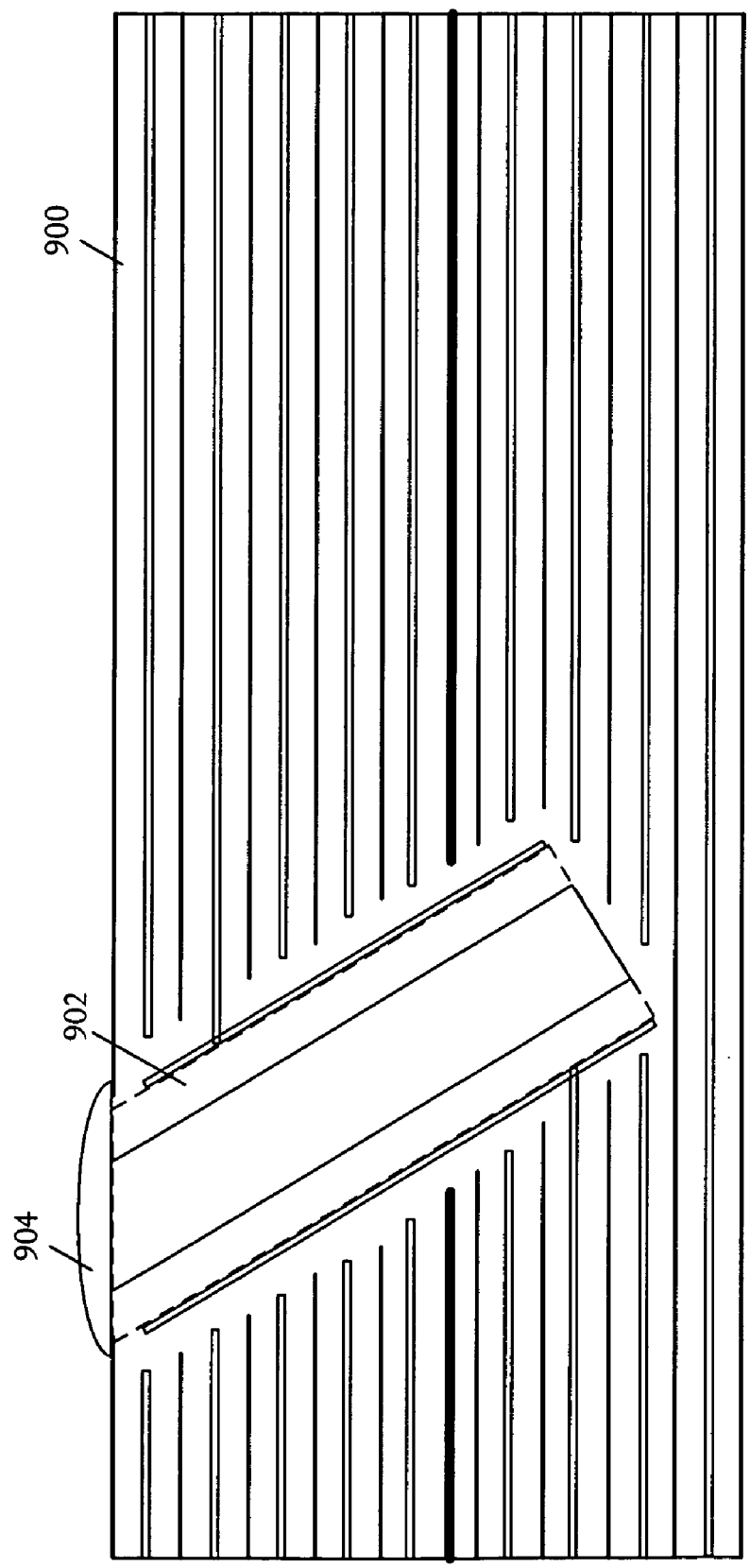
FIG. 9 is a conceptual cross-sectional view showing another example embodiment of a substrate including a component capable of usage for impedance matched switching.

Referring to FIG. 9, a conceptual cross-sectional view shows another example embodiment of a substrate 900 including a component 902 capable of usage for impedance matched switching. The hole in the substrate 900 can be formed in any suitable configuration or angle and the component 902 can have any suitable shape. The illustrative component 902 has a grounding head 904 that connects with the component body at an acute angle.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Although the illustrative components shown in the various figures are cylindrical, other shapes are possible. For example, a rectangular shape may be suitable in some applications. Even other shapes may be possible, for example a triangular shape, spiral shape, or any other. The configuration of internal core, dielectric, and outer conductive layer need not be symmetric and can have any suitable arrangement.

In the claims, unless otherwise indicated the article "a" is to refer to "one or more than one."

What is claimed is:

1. A component comprising:
    a plug configured for insertion into a hole in a printed circuit board comprising:
        a conductive ground core configured for insertion into the hole in a multiple-layer substrate of the printed circuit board to extend through multiple-layers of the substrate;
        a head of the conductive ground core forming a conductive ground connect electrically coupled to an end of the conductive ground core, the head configured to extend past the hole to mount the plug onto the printed circuit board and connect the conductive ground core to a ground reference layer on a surface of the printed circuit board;
    a dielectric layer encasing the conductive ground core; and
    a signal conductor layer coupled to the dielectric layer, electrically isolated from the conductive ground core and the conductive ground connect.

2. The component according to claim 1 wherein:
dimensions and material of the conductive ground core, the dielectric layer, and the signal conductor layer are selected for impedance matching of the substrate.

3. The component according to claim 1 wherein:
the component is a single-ended component and the signal conductor layer is configured as a single contiguous layer at least partly encasing the dielectric layer.

4. The component according to claim 1 wherein:
the component is a differential pair component and the signal conductor layer is configured as a pair of separated signal conductors conductively contacting different signal tracks in the substrate.

5. The component according to claim 1 further comprising:
the conductive ground core extending along a longitudinal axis that is essentially parallel with a longitudinal axis of the hole in the substrate; and
the dielectric layer having a cylindrical configuration with a longitudinal axis parallel to the ground core longitudinal axis.

6. The component according to claim 1 wherein:
the component is impedance-controlled according to selection of dielectric material in the dielectric layer and relative spacing among the conductive ground core and at least one conductor in the signal conductor layer.

7. A substrate comprising:
a printed circuit board comprising a plurality of substrate layers including signal track layers and isolation layers, the substrate layer plurality being penetrated by a hole at a location suitable for transferring a signal between at least two signal track layers; and
a component for insertion into the hole enabling signal transfer between the at least two signal track layers, the component comprising:
    a plug configured for insertion into the hole in the printed circuit board comprising:
        a conductive ground core arranged for insertion into the hole through multiple-layers of the substrate layer plurality;
        a head of the conductive ground core forming a conductive ground connect electrically coupled to an end of the conductive ground core, the head configured to extend past the hole to mount the plug onto the printed circuit board and connect the conductive ground core to a ground reference layer on a surface of the printed circuit board;
        a dielectric layer encasing the conductive ground core; and
        a signal conductor layer coupled to the dielectric layer, electrically isolated from the conductive ground core and the conductive ground connect, dimensions and material of the conductive ground core, the dielectric layer, and the signal conductor layer selected for impedance matching of the substrate.

8. The substrate according to claim 7 further comprising:
a ground plane layer on an outer substrate layer; and
the conductive ground connect in the component that is electrically coupled to an end of the conductive ground core and conductively contacts the ground plane layer when the component is completely inserted into the hole and mounted to the printed circuit board.

9. The substrate according to claim 7 wherein:
the component is a single-ended component and the signal conductor layer is configured as a single contiguous layer at least partly encasing the dielectric layer.

10. The substrate according to claim 7 wherein:
the component is a differential pair component and the signal conductor layer is configured as a pair of separated signal conductors conductively contacting different signal tracks in the substrate.

11. The substrate according to claim 7 further comprising:
the conductive ground core extending along a longitudinal axis that is essentially parallel with a longitudinal axis of the hole in the substrate; and
the dielectric layer having a cylindrical configuration with a longitudinal axis parallel to the ground core longitudinal axis.

12. The substrate according to claim 7 wherein:
the component is impedance-controlled according to selection of dielectric material in the dielectric layer and relative spacing among the conductive ground core and at least one conductor in the signal conductor layer.

13. The substrate according to claim 7 further comprising:
ground stitching and/or vias formed in selected substrate layers in a selected position relative to the component.

14. The substrate according to claim 7 wherein:
the substrate is configured as a multiple-layer printed circuit board (PCB).

15. A method for connecting signal tracks in a substrate comprising:
providing a printed circuit board comprising substrate with a plurality of substrate layers including signal track layers and isolation layers;
forming a hole in the substrate layer plurality at a location suitable for transferring a signal between at least two signal track layers;
inserting into the hole an impedance-controlled component comprising a plug configured for insertion into the hole in the printed circuit board further comprising an internal conductive ground core, a head of the conductive ground core forming a conductive ground connect electrically coupled to an end of the conductive ground core, the head configured to extend past the hole to mount the plug onto the printed circuit board and connect the conductive ground core to a ground reference layer on a surface of the printed circuit board, a dielectric layer encasing the conductive ground core, and a signal conductor layer overlying the dielectric layer, electrically isolated from the conductive ground core and the conductive ground connect;
mounting the impedance-controlled component to the printed circuit board; and
selecting dimensions and material of the conductive ground core, the dielectric layer, and the signal conductor layer for impedance matching of the substrate.

16. The method according to claim 15 further comprising:
constructing the impedance-controlled component comprising:
forming the conductive ground core;
forming the conductive ground connect as a head of the conductive ground core;
forming a dielectric layer exterior to the conductive ground core with a dielectric layer; and
forming a signal conductor layer exterior to the dielectric layer.

17. The method according to claim 16 further comprising:
forming a pattern in the signal conductor layer that separates the signal conductor layer into differential signal conductors.

18. The method according to claim 16 further comprising:
providing the substrate with a ground plane layer on an outer substrate layer; and
conductively coupling the conductive ground connect to the ground plane layer.

19. The method according to claim 15 further comprising:
configuring the component as a single-ended component and the signal conductor layer as a single contiguous layer at least partly encasing the dielectric layer.

20. The method according to claim 15 further comprising:
configuring the component as a differential pair component and the signal conductor layer as a pair of separated signal conductors conductively contacting different signal tracks in the substrate.

21. The method according to claim 15 further comprising:
forming the conductive ground core as a conductive rod extending along a longitudinal axis; and
forming the dielectric layer in a cylindrical configuration with a longitudinal axis parallel to the ground core longitudinal axis.

22. The method according to claim 15 further comprising:
controlling impedance in the component comprising:
selecting a dielectric material for usage in the dielectric layer; and
selecting relative spacing among the conductive ground core and at least one conductor in the signal conductor layer.

23. The method according to claim 15 further comprising:
forming ground stitching and/or vias in selected substrate layers in a selected position relative to the component.

24. A component for insertion into a hole in a printed circuit board comprising multiple-layer substrate enabling impedance matching of the substrate, the component comprising:
a plug means configured for insertion into a hole in a printed circuit board, the plug means comprising:
ground core means for conductively coupling to a ground plane in an arrangement that extends through multiple-layers of the substrate when the component is inserted;
ground connect means for connecting the ground core means to a ground reference, the ground connect means configured as a head of the ground core means and configured to extend past the hole to mount the plug means onto the printed circuit board;
dielectric means for isolating the ground plane conductive coupling means encasing the ground core means; and
signal conductor means for conducting signals coupled to the dielectric isolating means encasing the dielectric means and the ground core means, wherein dimensions and material of the ground core means, the dielectric means, and the signal conductor means configured for impedance matching of the substrate.

* * * * *